United States Patent
Shue et al.

(10) Patent No.: US 8,101,489 B2
(45) Date of Patent: Jan. 24, 2012

(54) APPROACH TO REDUCE THE CONTACT RESISTANCE

(75) Inventors: Shau-Lin Shue, Hsinchu (TW); Ting-Chu Ko, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/021,062

(22) Filed: Jan. 28, 2008

(65) Prior Publication Data

US 2009/0191684 A1    Jul. 30, 2009

(51) Int. Cl.
    *H01L 21/336* (2006.01)
(52) U.S. Cl. .................. 438/307; 257/E21.409
(58) Field of Classification Search .......... 438/307; 257/E21.409
    See application file for complete search history.

(56) References Cited

U.S. PATENT DOCUMENTS

| | | |
|---|---|---|
| 5,134,447 A | 7/1992 | Ng et al. |
| 6,365,476 B1 * | 4/2002 | Talwar et al. ............. 438/308 |
| 6,908,822 B2 | 6/2005 | Rendon et al. |
| 7,071,046 B2 | 7/2006 | Yang et al. |
| 7,169,675 B2 | 1/2007 | Tan et al. |
| 2006/0130971 A1 * | 6/2006 | Chang et al. .......... 156/345.48 |
| 2007/0122987 A1 * | 5/2007 | Hsiao et al. ............ 438/301 |

* cited by examiner

*Primary Examiner* — Alexander Ghyka
*Assistant Examiner* — Stanetta Isaac
(74) *Attorney, Agent, or Firm* — Haynes and Boone, LLP

(57) ABSTRACT

A method for fabricating a semiconductor device is disclosed. First, a semiconductor substrate having a doped region(s) is provided. Thereafter, a pre-amorphous implantation process and neutral (or non-neutral) species implantation process is performed over the doped region(s) of the semiconductor substrate. Subsequently, a silicide is formed in the doped region(s). By conducting a pre-amorphous implantation combined with a neutral species implantation, the present invention reduces the contact resistance, such as at the contact area silicide and source/drain substrate interface.

19 Claims, 4 Drawing Sheets

APPROACH TO REDUCE THE CONTACT RESISTANCE

BACKGROUND

The present disclosure relates generally to the field of semiconductor devices, and more particularly, to a method for fabricating a semiconductor device with reduced contact resistance, such as between a contact area silicide and a source/drain substrate.

In semiconductor device fabrication, numerous conductive structures, such as gate electrodes, contacts, vias, and interconnects, may be formed in or above a semiconductor substrate, isolated from one another by dielectric layers. At the various fabrication stages, it may be necessary to form openings in the dielectric layers to allow for contact to underlying regions or layers. Generally, the vertical openings through a dielectric layer that connect the first metal layer to the devices formed in the semiconductor substrate are called "contacts." The vertical openings in other dielectric layers, such as an opening that connects between an upper metal layer and a lower metal layer, are referred to as "vias."

A contact opening may expose a doped region such as a source or drain. For example, a contact (plug) connects between a back end of line (BEOL) interconnect and a front end of line (FEOL). Metals like tungsten are often employed for the contact material. Beneath the contact, there are two additional layers between the source or drain and the contact itself. The first layer, a bottom contact barrier, prevents contact materials from diffusing to the source or drain and impacts the leakage. The other layer, between the bottom contact barrier and source or drain, is a layer of silicide, which ensures low parasitic resistance.

High quality contacts are essential to high device yield and reliability, but fabrication of these high quality contacts poses challenges, specifically when trying to maintain a relatively low contact resistance. Ideally, in an ohmic contact interface, a low contact resistance resulting from a difference in work functions does not exist between the silicide and semiconductor substrate. However, in reality, the contact resistance at the silicide/semiconductor substrate interface is relatively high, even though the barrier height between them is low. This often results from implantation processes, which leave implantation induced defects present even after salicidation. The existing defects interact with the silicide, resulting in junction leakage. Other factors also increase the contact resistance, such as the roughness of the silicide/semiconductor interface, work function between silicide and the semiconductor substrate, the substrate doping concentration, etc.

Accordingly, what is needed is a method for improving the contact resistance created in the semiconductor fabrication process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
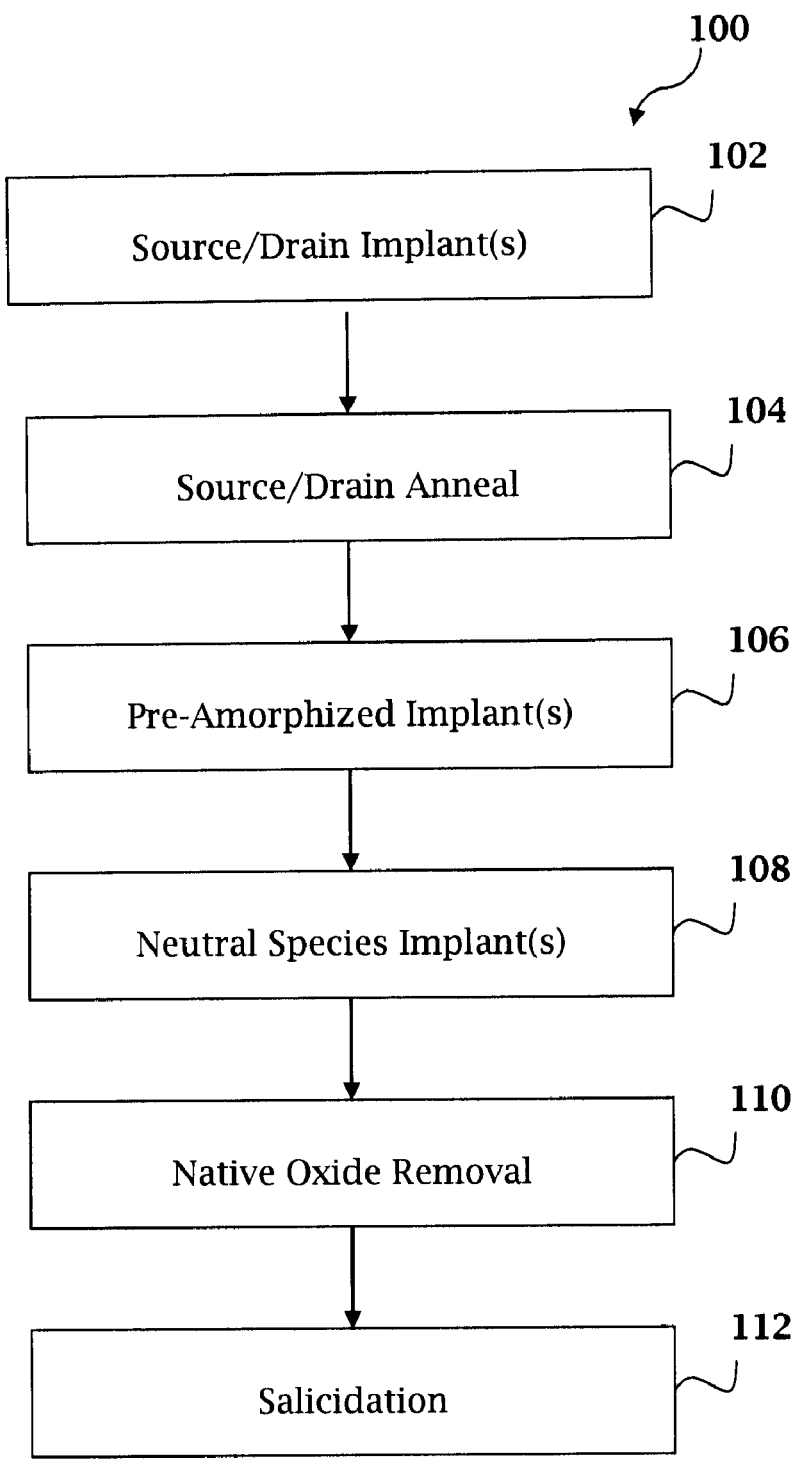
FIG. 1 is a flow chart of a method for forming a semiconductor device according to aspects of the present disclosure.

The present disclosure relates generally to the field of semiconductor devices, and more particularly, to a method for fabricating a semiconductor device with reduced contact resistance, such as between a contact area silicide and a source/drain substrate.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 through 7, a method 100 and a semiconductor device 200 are collectively described below. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device.

In the present embodiment, the semiconductor device 200 includes a substrate 210 having an isolation region 212, a gate structure 216, and gate spacers 218. The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; or an alloy semiconductor including SiGe, GaAsP, AlInAs, AlGaAs, GaInAs, GaInP, and GaInAsP; or any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure.

The isolation region 212 may utilize isolation technology, such as local oxidation of silicon (LOCOS) or shallow trench isolation (STI).

The gate structure 216 may be any type of gate structure, including polysilicon, metal, non-volatile memory, or a silicon-oxide-nitride-oxide-silicon (SONOS) structure. Further, the gate structure 216 may include one or many different layers. The gate structure 216 may be composed of a gate dielectric and a gate electrode. The gate dielectric may be a suitable dielectric material or may have a multilayer structure comprising multiple dielectric materials. Preferably, the dielectric material will have relatively high integrity and low current leakage. Examples of the dielectric material include silicon oxide, silicon nitride, silicon oxynitride, and any other high-k dielectric material. The high k dielectric may include hafnium oxide, zirconium oxide, aluminum oxide, a hafnium dioxide-alumina ($HfO_2$—$Al_2O_3$) alloy, or combinations thereof. In other embodiments, the gate dielectric may be doped polycrystalline silicon with the same or different doping. The gate electrode may comprise polycrystalline silicon; silicon-containing materials; germanium-containing materials; metal, such as aluminum, copper, tungsten, titanium, tantulum, titanium nitride, tantalum nitride, nickel silicide, cobalt silicide; other proper conductive materials; and combinations thereof. Further, the gate electrode and gate dielectric may comprise conductive materials and may have a multilayer structure. The conductive material may comprise polycrystalline silicon, poly-SiGe, metal, metal silicide, metal nitride, metal oxide, or combinations thereof. The gate spacers 218, which are positioned on each side of the gate structure 216, may comprise a dielectric material such as silicon nitride, silicon oxide, silicon carbide, silicon oxynitride, other suitable materials, or combinations thereof.

It is understood that in alternate embodiments, the semiconductor device 200 may not include a gate structure 216 or gate spacers 218. For example, the semiconductor device 200 may include a substrate 212 having an isolation region 212, absent a gate structure 216 (or gate dielectric and gate electrode) and/or gate spacers 218.

Figure 2:
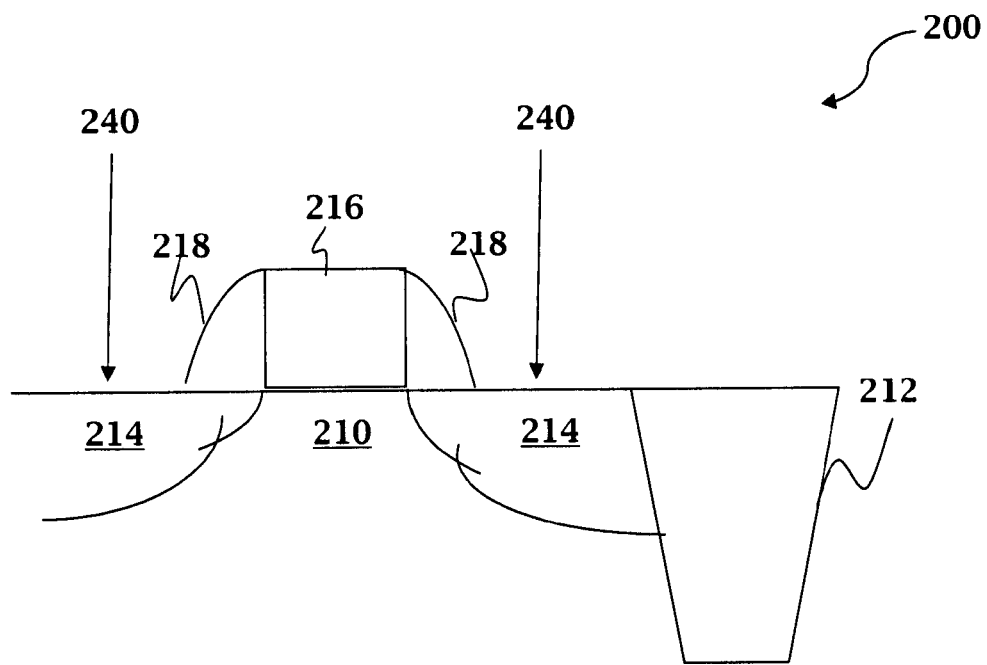
FIGS. 2-7 are various cross-sectional views of one embodiment of a semiconductor device during various fabrication stages made by the method of FIG. 1.

Referring to FIGS. 1 and 2, the method 100 begins at step 102 wherein various doped region(s) 214 are formed in the semiconductor substrate 210. The doped region(s) 214 are formed by a suitable process such as ion implantation 240. In one embodiment, the doped region(s) are doped n-type or p-type. In the present embodiment, the doped regions 214 include a source and drain region. The source and drain regions may be formed directly on the semiconductor substrate 210, in a P-well structure, in a N-well structure, in a dual-well structure, or using a raised structure. The source and drain regions may comprise various doping profiles and may be formed by a plurality of ion implantation processes, such as lightly doped drain (LDD) implant processes and source/drain (S/D) implant processes. Alternate embodiments may have only one doped region or multiple doped regions.

Figure 3:
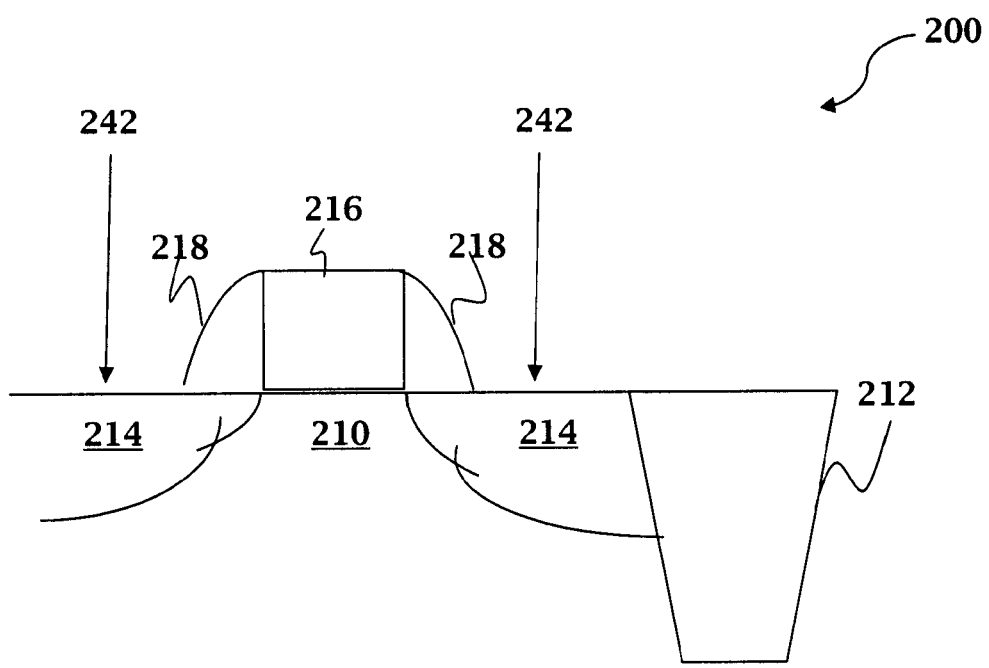

Next, referring to FIGS. 1 and 3, the method 100 proceeds to step 104 where an annealing process 242 is performed, such as a rapid thermal process (RTP), to activate the doped region(s).

Figure 4:
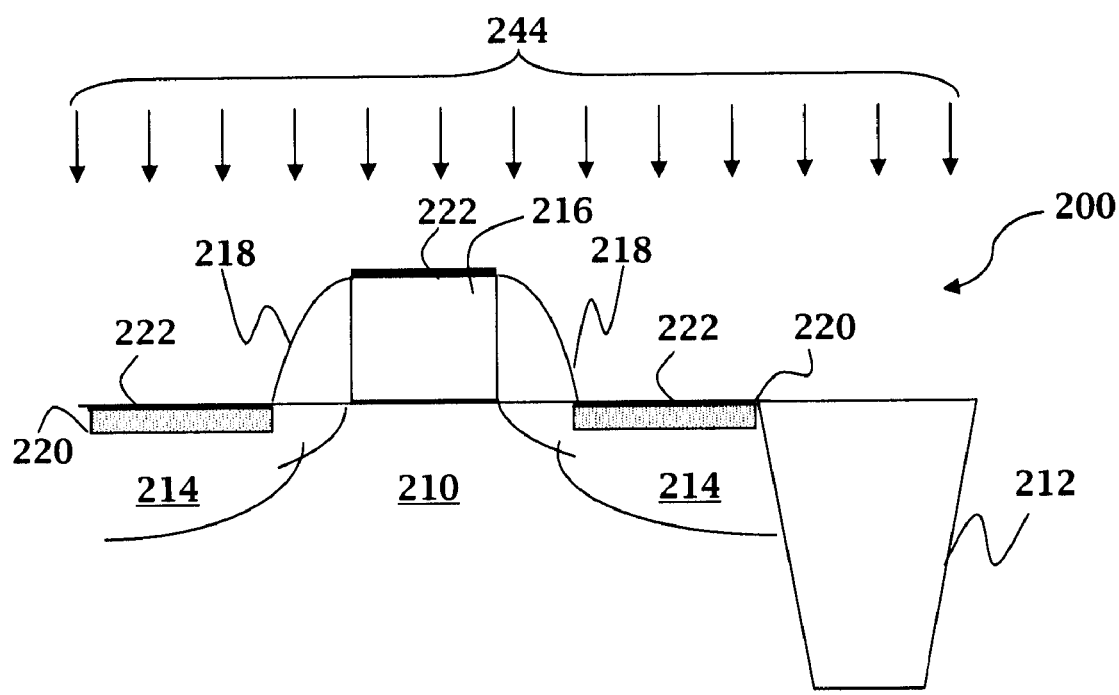

Referring to FIGS. 1 and 4, after the doped region(s) 214 have been formed, the method 100 proceeds to step 106 where a pre-amorphization implantation (PAI) process 244 is conducted to form amorphous regions 220.

Pre-amorphization implantation is utilized to reduce contact resistance. During semiconductor device fabrication, defects in the semiconductor device 200 arise from various processes, such as those in method 100. Prior to a salicidation process, defects in the device arise mostly from implantation processes (e.g., from ion implantation 240 that forms doped region(s) 214), which are not fully removed even after a high-temperature anneal. PAI's major purpose is to eliminate pre-salicidation defects in regions where a silicide will be formed by destroying the crystal structure of such regions. As a result, the PAI reduces contact resistance at the salicide/doped region(s) interface by providing a way to form silicide with a smooth profile.

PAI involves implanting a semiconductor substrate with an electrically inactive species, such as silicon, germanium, indium, xenon, argon, and/or other suitable electrically inactive species, to amorphize a thin layer of a single-crystal, poly-crystalline, or other structure substrate to reduce channeling during subsequent implantation processes. For example, in one embodiment, the PAI process involves injecting atoms smaller than a polysilicon semiconductor substrate material, such as silicon, into the substrate to form an amorphized region and damage the lattice structure.

PAI provides several advantages: (1) silicide depth can be well controlled by PAI because silicide formation will occur only in the pre-amorphized layer; (2) PAI makes the profile of silicide more uniform by forming a sharp interface between the silicide and semiconductor substrate; (3) PAI increases nucleation sites and reduces silicide formation energy; and (4) PAI reduces the impact of crystal defects, resulting from pre-processes such as ion implantation, on device performance.

The PAI process 244 may utilize any implant species, such as carbon, helium, neon, argon, nitrogen, other suitable species, and/or combinations thereof. In one embodiment, the PAI is implanted at an energy ranging from approximately 0.1 keV to 40 keV and a dosage ranging from approximately $1 \times 10^{13}$ atoms/cm$^3$ to $1 \times 10^{16}$ atoms/cm$^3$. In alternate embodiments, the amorphous regions 220 may be formed by a plurality of PAI processes. The PAI process effectively eliminates junction leakage by amorphizing the defect area arising from the ion implantation process(es) 240 above.

When a semiconductor wafer, or as in the present embodiment, a semiconductor device 200, is exposed to air, molecular layers of moisture adsorb on the wafer instantly. Oxygen from the surrounding is dissolved into the adsorbed moisture layer on the wafer surface and penetrates into the wafer surface. This process causes the surface of the wafer to oxidize, even at room temperature. This thin oxide layer is called native oxide. After the PAI process 244, a native oxide layer 222 exists over the amorphous regions 220 and gate structure 216.

Though PAI results in the above advantages, PAI tends to result in a higher than desirable interfacial resistance at the silicide/semiconductor substrate interface. As a result, semiconductor device performance degrades. Therefore, another process is provided to further reduce such interfacial resistance.

Figure 5:
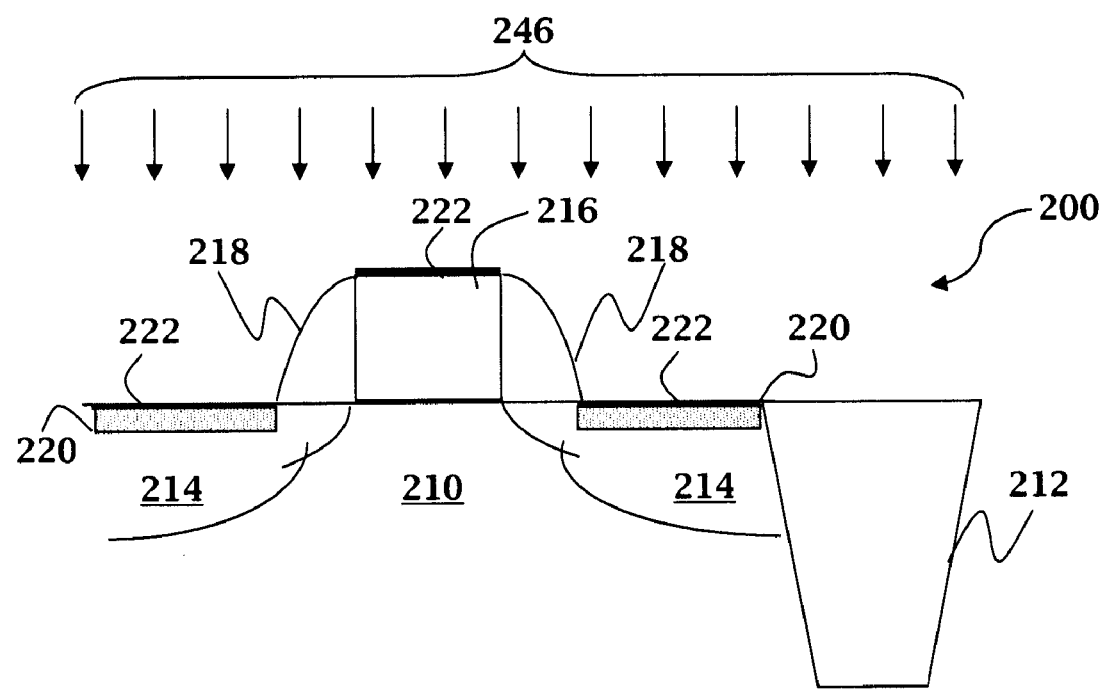

Referring to FIGS. 1 and 5, at step 108, a neutral species implantation process 246 is conducted by implanting neutral species atoms into the substrate 210, such that the implanted neutral species atoms will react with the amorphous regions 220 of the doped region(s) 214. In one embodiment, the neutral species implant may be carbon, germanium, xenon, silicon, argon, helium, neon, nitrogen, other suitable neutral species, and/or combinations thereof. Alternate embodiments may use non-neutral species and/or other species. In one embodiment, after the neutral species implantation, the implanted neutral species concentration extends for a depth between approximately 1 nm and 30 nm from the substrate surface. The neutral species implantation process adjusts the work function of the later-formed silicide and increases the doping concentration at the salicide/doped region interface, resulting in tunneling and improving the salicide/doped region interfacial resistance.

In yet another embodiment, the neutral species implant includes a first carbon implantation and a second carbon implantation. The first carbon implantation is implanted at an energy ranging from approximately 0.1 keV to 20 keV and a dosage ranging from approximately $1 \times 10^{13}$ atoms/cm$^3$ to $1 \times 10^{17}$ atoms/cm$^3$. The second carbon implantation is implanted at an energy ranging from approximately 0.1 keV to 40 keV and a dosage ranging from approximately $1\times10^{10}$ atoms/cm$^3$ to $1\times10^{17}$ atoms/cm$^3$. Note further, that in alternate embodiments, the neutral species implant may include a first and second neutral species implantation of germanium, xenon, silicon, argon, helium, neon, nitrogen, any other suitable neutral species, and combinations thereof. Further, in alternate embodiments, the neutral species implant may consist of multiple neutral species implantation processes.

Figure 6:
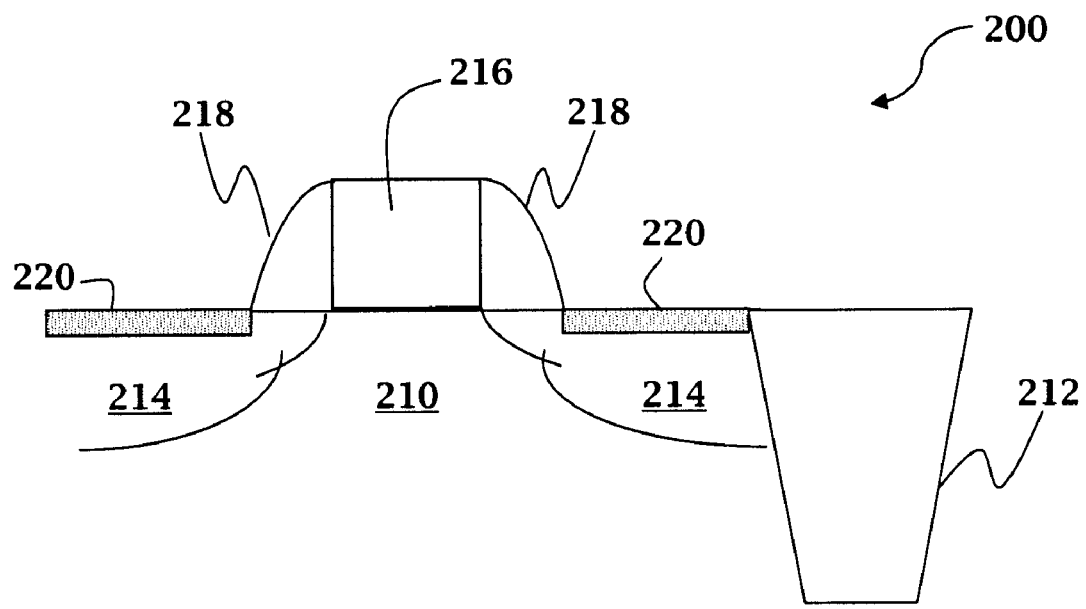

Referring to FIGS. 1 and 6, the method 100 proceeds to step 110 by removing any residue and the native oxide layer 222 from the gate structure 216 and the amorphous regions 220. The native oxide layer 222 may be removed by using one or more of a variety of cleaning methods. In one embodiment, a mixture of $NH_3$ and $NF_3$ is used as a chemical cleaner. The chemical cleaner reacts with the native oxide to form an oxide layer. Then, an annealing process may be performed on the oxide layer to sublimate the oxide film. This leaves the gate structure 216 and amorphous regions 220 free of the native oxide layer 222 and any other residue.

Figure 7:
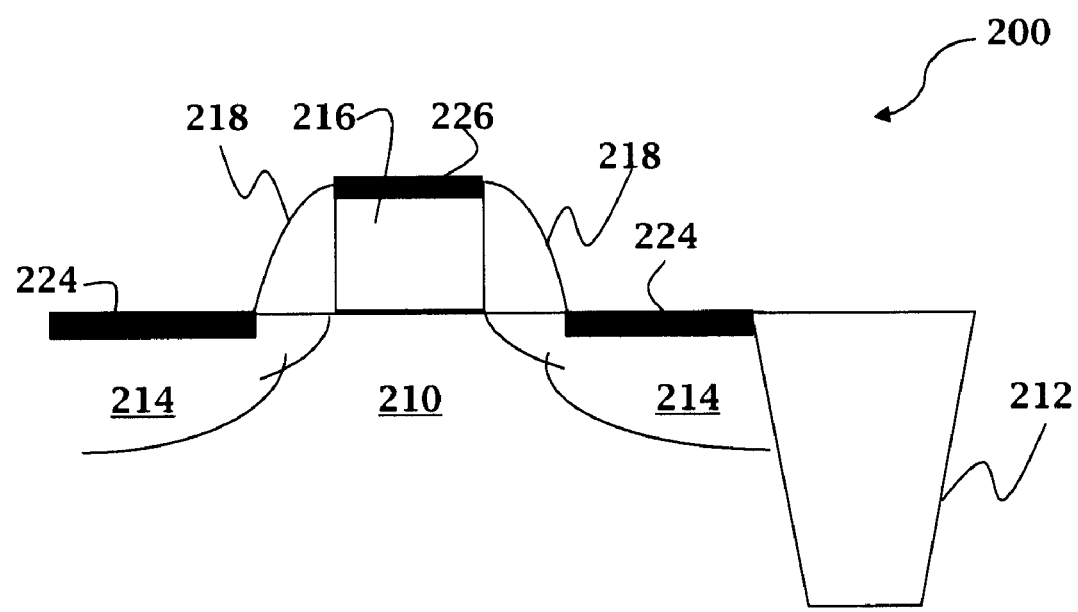

Referring to FIGS. 1 and 7, at step 112, a silicide is formed in the amorphous regions 220 to form doped silicide regions 224. The silicide may also be formed in the gate structure 216 to form a gate silicide region 226. The silicide regions 224 and 226 may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and combinations thereof. The materials utilized to create the silicide may be deposited using physical vapor deposition (PVD) such as sputtering and evaporation; plating; chemical vapor deposition (CVD) such as plasma enhanced CVD (PECVD), atmospheric pressure CVD (APCVD), low pressure CVD (LPCVD), high density plasma CVD (HDPCVD) and atomic layer CVD (ALCVD); or other suitable deposition processes. After deposition, the salicidation process may continue with a reaction between the deposited material and the semiconductor substrate at an elevated temperature that is selected based on the specific material or materials. This is also referred to as annealing, which may include a rapid thermal annealing process (RTP). The reacted silicide may require a one step RTP or multiple step RTPs.

Overall, by conducting a pre-amorphous implantation process in conjunction with a neutral species implantation process, the present invention reduces the contact resistance of the salicide/doped region interface (in the present embodiment, the salicide/source-drain interface). Specifically, the pre-amorphous implantation process eliminates the source of junction leakage by amorphorizing the defect area created during the ion implantation processes; and the neutral species implantation process adjusts the silicide's work function, resulting in an improved salicide/doped region interfacial resistance.

In summary, a method is provided for fabricating a semiconductor device to reduce the contact resistance. The method comprises providing a semiconductor substrate, forming a gate structure on the semiconductor substrate, and forming two doped regions in the semiconductor substrate adjacent to the gate structure. It is understood that in alternate embodiments, the method may comprise providing a semiconductor substrate absent a gate structure (i.e., providing a semiconductor substrate and forming two doped regions in the semiconductor substrate). A pre-amorphous implantation and a neutral species implantation are performed over the doped regions of the semiconductor substrate, forming a silicide in the two doped regions and gate structure. The method further comprises a step of annealing after forming two doped regions in the semiconductor substrate, and, before forming a silicide, the method includes removing native oxide by a chemical cleaning, $NH_3+NF_3$, and a step of annealing.

In some embodiments, the neutral species implantation comprises carbon, germanium, xenon, silicon, argon, and combinations thereof.

In some embodiments, the silicide is nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), and combinations thereof.

In some embodiments, the pre-amorphous implantation uses an implant energy from approximately 0.1 keV to 40 keV and an implant dosage from approximately $1\times10^{13}$ atoms/cm$^3$ to $1\times10^{16}$ atoms/cm$^3$.

In some embodiments, the neutral species implantation comprises a concentration of neutral species extending for a depth between approximately 1 nm and 30 nm from the substrate surface after implantation.

In some embodiments, the neutral species implantation comprises a first carbon implantation and a second carbon implantation. The first carbon implantation utilizes an implant energy from approximately 0.1 keV to 20 keV and an implant dosage from approximately $1\times10^{13}$ atoms/cm$^3$ to $1\times10^{17}$ atoms/cm$^3$. The second carbon implantation utilizes an implant energy from approximately 0.1 keV to 40 keV and an implant dosage from approximately $1\times10^{10}$ atoms/cm$^3$ to $1\times10^{17}$ atoms/cm$^3$.

In another embodiment, a method is provided for forming a semiconductor device that comprises providing a semiconductor substrate having a doped region, performing a pre-amorphous implantation over the doped region of the substrate, performing a neutral species implantation over the doped region of the substrate, and forming a silicide in the doped region.

In yet another embodiment, a method is provided for forming a semiconductor device that comprises providing a semiconductor substrate, forming source and drain regions in the semiconductor substrate, performing a pre-amorphous implantation over source and drain regions of the substrate, performing a neutral species implantation over the source and drain regions of the substrate, and forming a silicide in the source and drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
   providing a semiconductor substrate;
   forming a gate structure on the semiconductor substrate;
   forming a source and a drain in the semiconductor substrate, such that the gate structure is disposed between the source and the drain;
   performing a pre-amorphous implantation over the source and the drain of the semiconductor substrate;

performing a neutral species implantation, after completion of performing the pre-amorphous implantation, over the source and the drain of the semiconductor substrate; and forming a silicide region in the source and the drain.

2. The method of claim 1, after forming the source and the drain in the semiconductor substrate, further comprising a step of annealing.

3. The method of claim 1 wherein the pre-amorphous implantation comprises utilizing an implant energy from approximately 0.1 keV to approximately 40 keV.

4. The method of claim 1 wherein the pre-amorphous implantation comprises utilizing an implant dosage from approximately $1 \times 10^{13}$ atoms/cm$^3$ to approximately $1 \times 10^{16}$ atoms/cm$^3$.

5. The method of claim 1 wherein the neutral species implantation comprises carbon, germanium, xenon, silicon, argon, or combinations thereof.

6. The method of claim 5 wherein the neutral species implantation comprises a first carbon implantation.

7. The method of claim 6 wherein the first carbon implantation comprises utilizing an implant energy from approximately 0.1 keV to approximately 20 keV.

8. The method of claim 6 wherein the first carbon implantation comprises utilizing an implant dosage from approximately $1 \times 10^{13}$ atoms/cm$^3$ to approximately $1 \times 10^{17}$ atoms/cm$^3$.

9. The method of claim 5 wherein the neutral species implantation further comprises a second carbon implantation.

10. The method of claim 9 wherein the second carbon implantation comprises utilizing an implant energy from approximately 0.1 keV to approximately 40 keV.

11. The method of claim 9 wherein the second carbon implantation comprises utilizing an implant dosage from approximately $1 \times 10^{10}$ atoms/cm$^3$ to approximately $1 \times 10^{17}$ atoms/cm$^3$.

12. The method of claim 1 wherein the neutral species implantation comprises a concentration of neutral species extending for a depth between approximately 1 nm and approximately 30 nm from the substrate surface after implantation.

13. The method of claim 1, after performing the pre-amorphous implantation and neutral species implantation, further comprising removing a native oxide before forming the silicide region.

14. The method of claim 13 wherein removing the native oxide comprises a chemical cleaning.

15. The method of claim 14 wherein the chemical cleaning comprises utilizing $NH_3+NF_3$.

16. The method of claim 13, after removing the native oxide, further comprising a step of annealing.

17. The method of claim 1 wherein forming the silicide region comprises utilizing nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or combinations thereof.

18. A method for forming a semiconductor device, comprising:

providing a semiconductor substrate having formed therein a source and a drain of a gate structure;

performing a pre-amorphous implantation to form an amorphous region in the source and the drain of the substrate;

performing a neutral species implantation, after completion of performing the pre-amorphous implantation, to the amorphous region; and forming a silicide in the source and the drain, the amorphous region defining where the silicide forms in the source and the drain.

19. A method for forming a semiconductor device, comprising:

providing a semiconductor substrate;

forming a gate structure over the semiconductor substrate forming a source and drain in the semiconductor substrate, such that the gate structure is disposed between the source and drain;

thereafter, performing an annealing process to activate the source and drain;

thereafter, forming an amorphous region in the source and drain;

thereafter, performing a carbon implantation on the amorphous region after completion of forming the amorphous region; and thereafter, forming a silicide in the amorphous region.

* * * * *